(12) United States Patent
Takemoto et al.

(10) Patent No.: US 9,362,026 B2
(45) Date of Patent: Jun. 7, 2016

(54) OXIDE SUPERCONDUCTOR WIRE, CONNECTION STRUCTURE THEREOF, AND SUPERCONDUCTOR EQUIPMENT

(71) Applicant: FUJIKURA LTD., Tokyo (JP)

(72) Inventors: Tetsuo Takemoto, Sakura (JP); Hikaru Hidaka, Sakura (JP)

(73) Assignee: FUJIKURA LTD., Tokyo (JP)

( * ) Notice: Subject to any disclaimer, the term of this patent is extended or adjusted under 35 U.S.C. 154(b) by 0 days.

(21) Appl. No.: 14/653,435

(22) PCT Filed: Jan. 8, 2014

(86) PCT No.: PCT/JP2014/050128
§ 371 (c)(1),
(2) Date: Jun. 18, 2015

(87) PCT Pub. No.: WO2014/109326
PCT Pub. Date: Jul. 17, 2014

(65) Prior Publication Data
US 2015/0332812 A1    Nov. 19, 2015

(30) Foreign Application Priority Data

Jan. 9, 2013  (JP) ................. 2013-001947

(51) Int. Cl.
*H01B 12/06*    (2006.01)
*H01F 6/06*    (2006.01)
(Continued)

(52) U.S. Cl.
CPC ............ *H01B 12/06* (2013.01); *H01B 13/0036* (2013.01); *H01F 6/06* (2013.01); *H01L 39/02* (2013.01); *H01L 39/143* (2013.01); *H01L 39/248* (2013.01); *H01R 4/68* (2013.01); *H01R 43/00* (2013.01); *H02G 15/34* (2013.01); *Y02E 40/648* (2013.01)

(58) Field of Classification Search
CPC ................ H01B 12/00–12/06; H01B 13/0036; H01F 6/06; H01L 39/02; H01L 39/143
See application file for complete search history.

(56) References Cited

U.S. PATENT DOCUMENTS 7,774,035 B2 * 8/2010 Lee ........................ H01L 39/143
428/930
8,030,246 B2 * 10/2011 Otto ........................ H01L 39/02
174/125.1

(Continued)

FOREIGN PATENT DOCUMENTS

EP        2 728 591 A1    5/2014
JP        2000-133067 A   5/2000

(Continued)

OTHER PUBLICATIONS

Office Action of Japanese Application No. 2014-538548 dated Nov. 11, 2014.
Notice of Allowance of Japanese Application No. 2014-538548 dated Feb. 3, 2015.

*Primary Examiner* — Colleen Dunn
(74) *Attorney, Agent, or Firm* — Sughrue Mion, PLLC

(57) ABSTRACT

An oxide superconductor wire including: a superconductor laminate including a tape-shaped substrate, an interlayer, an oxide superconductor layer, and a protection layer which are formed on the substrate; a metal stabilization layer covering the periphery of the superconductor laminate; a first electrically conductive joint material arranged between the superconductor laminate and the metal stabilization layer; and a sealing member formed from a metal foil, connected to a terminal of the superconductor laminate, and extending in the longitudinal direction of the superconductor laminate, wherein the metal stabilization layer includes an extension part formed so as to cover the periphery of the sealing member, and wherein the first electrically conductive joint material includes an extension part arranged between the extension part of the metal stabilization layer and the sealing member and formed so as to cover the periphery of the sealing member.

8 Claims, 8 Drawing Sheets

(51) Int. Cl.
*H01L 39/02* (2006.01)
*H01B 13/00* (2006.01)
*H01R 43/00* (2006.01)
*H01R 4/68* (2006.01)
*H01L 39/14* (2006.01)
*H01L 39/24* (2006.01)
*H02G 15/34* (2006.01)

(56) References Cited

U.S. PATENT DOCUMENTS 8,195,260 B2 * 6/2012 Otto ................. H02G 15/34
174/21 R
2005/0016759 A1 * 1/2005 Malozemoff ......... H01L 39/143
174/125.1
2012/0065074 A1 * 3/2012 Xie ..................... H01R 4/68
505/234
2015/0200041 A1 * 7/2015 Mitsuhashi ............ H01R 4/68
505/220

FOREIGN PATENT DOCUMENTS

| | | |
|---|---|---|
| JP | 2007-266149 A | 10/2007 |
| JP | 2009-048987 A | 3/2009 |
| JP | 2011-134610 A | 7/2011 |
| JP | 2012-048850 A | 3/2012 |
| JP | 2012-169237 A | 9/2012 |
| WO | 2013/165001 A1 | 11/2013 |

* cited by examiner

OXIDE SUPERCONDUCTOR WIRE, CONNECTION STRUCTURE THEREOF, AND SUPERCONDUCTOR EQUIPMENT

CROSS REFERENCE TO RELATED APPLICATIONS

This application is a National Stage of International Application No. PCT/JP2014/050128, filed Jan. 8, 2014, claiming priority based on Japanese Patent Application No. 2013-001947, filed Jan. 9, 2013, the contents of all of which are incorporated herein by reference in their entirety.

TECHNICAL FIELD

The present invention relates to an oxide superconductor wire, a connection structure of the oxide superconductor wire, and a superconductor equipment including the connection structure.

BACKGROUND ART

As a low-loss electrically conductive material, superconductor equipment such as cable, coil, motor, and magnet with the use of an oxide superconductor is developed. As a superconductor used for the superconductor equipment, an oxide superconductor such as an RE-123-based oxide superconductor ($REBa_2Cu_3O_{7-x}$: RE being a rare-earth element containing Y, Gd etc.) is known. The RE-123 based oxide superconductor exhibits a superconductive property at around the liquid nitrogen temperatures and is capable of maintaining an excellent critical current density even in a strong magnetic field, and therefore is regarded as an extremely promising electrically conductive material in practice.

When applying the above-described oxide superconductor to electric equipment, the oxide superconductor processed into a wire is used as a conductor or a coil, in general. More specifically, an oxide superconductor wire can be obtained by forming an oxide superconductor layer on a metal substrate via an orientation layer having good crystal orientation, and laminating a protection layer and a metal stabilization layer so as to cover the oxide superconductor layer.

One of the issues for such an RE123-based oxide superconductor wire is that the rare earth-based oxide superconductor includes therein a material which is reactive with moisture. Thus, when using such an RE123-based oxide superconductor wire, it is important to consider a structure which is capable of preventing the oxide superconductor layer from deteriorating due to moisture. For example, a structure which is capable of preventing moisture from intruding from the terminal part of the oxide superconductor wire is required.

Conventionally, as a structure for sealing the connection part between the terminals of the oxide superconductor wires, a structure described in the following Patent Document 1 is known. In the structure described in Patent Document 1, the terminals of the tape-shaped superconductor wires of laminate structure are arranged so as to adjacent to each other, and a short-length superconductor wire for connection is provided which connects the wires so as to bridge therebetween. In this structure, the connection parts between the adjacent oxide superconductor wires and the short-length superconductor wire for connection are covered with an electrically conductive filler for sealing.

PRIOR ART DOCUMENTS

Patent Documents

[Patent Document 1] U.S. Pat. No. 8,030,246

DISCLOSURE OF INVENTION

Problems to be Solved by the Invention

In the connection structure described in Patent Document 1, when using a low melting point metal such as Sn as an electrically conductive filler, it is considered that, after establishing the connection structure with a commonly known method such as soldering, the terminal part is sealed by applying melted Sn to the terminal part to seal the connection part.

However, when using an RE123-based oxide superconductor wire, there are some difficulties for completion of such a sealing.

In an RE123-based oxide superconductor wire, an oxide superconductor layer is laminated on a tape-shaped substrate via a plurality of interlayers, the substrate being made of a heat resistant nickel alloy such as HASTELLOY (Trade name, HAYNES INT. INC., USA), and further a protection layer and a metal stabilization layer are overlaid. The heat resistant Ni alloy constituting the substrate is difficult to be adhered to solder. Moreover, the interlayer and the oxide superconductor layer laminated on the substrate are an oxide layer or a ceramic layer, and thus are difficult to be adhered to solder as is the case with the substrate.

In view of the above, it is difficult to cover with solder the both side faces of the tape-shaped oxide superconductor wire (the side faces of the substrate, the side faces of the interlayer, and the side faces of the superconductor layer) and the surface of the stabilizer formed on the back face thereof in a tightly sealed manner. Accordingly, it is desired to provide a structure in which the entirety of the terminal or the entirety of the connection part of an RE123-based oxide superconductor wire is completely covered with a low melting point metal such as solder.

The present invention was made in view of the above-described circumstances, and the object thereof is to provide an oxide superconductor wire having a structure capable of preventing moisture from intruding from the terminal part, a connection structure thereof, and a superconductor equipment including the connection structure.

Means for Solving the Problems

An oxide superconductor wire according to an aspect of the present invention includes: a superconductor laminate including a tape-shaped substrate, an interlayer, an oxide superconductor layer, and a protection layer which are formed on the substrate; a metal stabilization layer covering the periphery of the superconductor laminate; a first electrically conductive joint material arranged between the superconductor laminate and the metal stabilization layer; and a sealing member formed from a metal foil, connected to a terminal of the superconductor laminate, and extending in the longitudinal direction of the superconductor laminate, wherein the metal stabilization layer includes an extension part formed so as to cover the periphery of the sealing member, and wherein the first electrically conductive joint material includes an extension part arranged between the extension part of the metal stabilization layer and the sealing member and formed so as to cover the periphery of the sealing member.

Since the tape-shaped superconductor laminate and the sealing member connected to the terminal thereof are covered with the electrically conductive joint material, the metal stabilization layer, and their extension part, it is possible to prevent moisture from intruding from the terminal part. Since the sealing member is formed of a metal foil, the electrically conductive joint material is capable of joining the extension part of the metal stabilization layer to the sealing member in a tightly sealed manner. As a result, it is possible to provide a terminal structure capable of preventing moisture intrusion.

It may be arranged such that the sealing member is butt-welded to the terminal of the superconductor laminate.

Since the sealing member is butt-welded to the terminal of the superconductor laminate, no difference in level or the like exists at the terminal of the superconductor laminate. In addition, since the superconductor laminate and the sealing member are covered with the metal stabilization layer via the electrically conductive joint material, it is possible to provide a terminal structure capable of preventing moisture intrusion.

It may be arranged such that a recess is formed in the terminal of the superconductor laminate, and an end of the sealing member is overlaid on and welded to the recess.

Since the sealing member is connected to the recess provided at the terminal of the superconductor laminate, the difference in thickness can be absorbed at the recess and thereby reducing a difference in level at the terminal of the superconductor laminate due to the difference in thickness between the superconductor laminate and the sealing member even if the thickness of the sealing member is different from the thickness of the superconductor laminate. Therefore, the periphery of the sealing member connected to the superconductor laminate with the reducing the difference in level can be covered with the electrically conductive joint material and the extension part of the stabilization layer in a tightly sealed manner. As a result, it is possible to achieve a sealing structure capable of preventing moisture intrusion.

A connection structure of an oxide superconductor wire according to an aspect of the present invention includes: two of any one the above-described oxide superconductor wire; and a second electrically conductive joint material joining the two oxide superconductor wires together, wherein upper faces of the metal stabilization layers arranged at an upside of the oxide superconductor wires are mutually overlaid so as to oppose to each other, and are joined together with the second electrically conductive joint material.

Since the terminal part of the oxide superconductor wire includes a sealing structure for the prevention of moisture intrusion, it is possible to provide a connection structure capable of preventing moisture intrusion at which the two oxide superconductor wire are mutually connected.

A connection structure of an oxide superconductor wire according to an aspect of the present invention includes: a first oxide superconductor wire, a second oxide superconductor wire, and a third oxide superconductor wire which are any one of the above-described oxide superconductor wire; a third electrically conductive joint material joining the first oxide superconductor wire and the third oxide superconductor wire together; and a fourth electrically conductive joint material joining the second oxide superconductor wire and the third oxide superconductor wire together, wherein an upper face of the metal stabilization layer arranged at an upside of the first oxide superconductor wire and an upper face of the metal stabilization layer arranged at an upside of the third oxide superconductor wire are mutually overlaid so as to oppose to each other, and are joined together with the third electrically conductive joint material, and wherein an upper face of the metal stabilization layer arranged at an upside of the second oxide superconductor wire and the upper face of the metal stabilization layer arranged at the upside of third oxide superconductor wire are mutually overlaid so as to oppose to each other, and are joined together with the fourth electrically conductive joint material.

Since the terminal part of the oxide superconductor wire includes a sealing structure for the prevention of moisture intrusion, it is possible to provide a connection structure capable of preventing moisture intrusion even at the connection part between the first oxide superconductor wire and the third oxide superconductor wire and the connection part between the second oxide superconductor wire and the third oxide superconductor wire.

A superconductor equipment according to an aspect of the present invention includes any one of the above-described oxide superconductor wire.

According to the superconductor equipment, since the oxide superconductor wire includes in the terminal part thereof a structure for the prevention of moisture intrusion, it is possible to provide a superconductor equipment without deterioration in superconductive properties due to moisture.

A superconductor equipment according to an aspect of the present invention includes any one of the above-described connection structure of a oxide superconductor wire.

According to the superconductor equipment, a structure for the prevention of moisture intrusion is provided in the connection part between the oxide superconductor wires, it is possible to provide a superconductor equipment without deterioration in superconductive properties due to moisture.

Effects of the Invention

According to the above-described aspects of the present invention, it is possible to provide an oxide superconductor wire in which deterioration due to moisture intrusion hardly occurs in the terminal part, and a connection structure using the oxide superconductor wire. In addition, according to the aspects of the present invention, it is possible to provide a superconductor equipment in which deterioration due to moisture intrusion hardly occurs.

EMBODIMENTS FOR CARRYING OUT THE INVENTION

Figure 1:
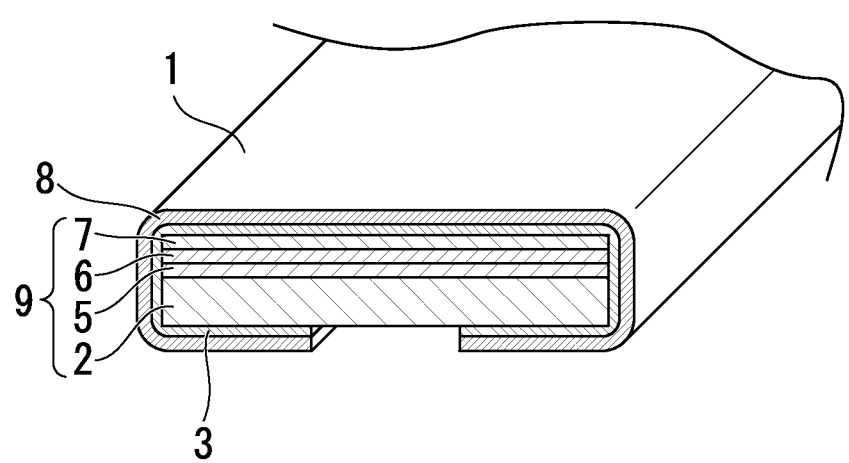
FIG. 1 is a partially cross-sectional perspective view showing a laminate structure of an oxide superconductor wire according to the first embodiment of the present invention.

Hereinafter, oxide superconductor wire, connection structure of the oxide superconductor wire, and manufacturing method of these according to the embodiments of the present invention will be described in detail with reference to the drawings. It should be noted that, in the drawings, some parts are magnified in shape for the purpose of explanation, but the proportions, for example, of the components shown in the drawings are not necessarily the same as the actual ones.

As shown in FIG. 1, an oxide superconductor wire 1 according to the present embodiment includes: a superconductor laminate 9 including a tape-shaped substrate 2, an interlayer 5 laminated on one face (front surface) of the substrate 2, an oxide superconductor layer 6, and a protection layer 7; and a metal stabilization layer 8 covering the outer periphery of the superconductor laminate 9. In an example shown in FIG. 1, the metal stabilization layer 8 is formed in substantially a C shape in the lateral cross-sectional view so as to cover the entire periphery of the superconductor laminate 9 except for the center part of the back face of the substrate 2.

On substantially the entire inner peripheral surface of the metal stabilization layer 8, an electrically conductive joint material 3 (first electrically conductive joint material) formed of a solder layer or the like is arranged. The metal stabilization layer 8 is tightly adhered to the peripheral surface of the superconductor laminate 9 via the electrically conductive joint material 3.

FIG. 1 shows a structure of the oxide superconductor wire 1 in the lateral cross-section thereof. The oxide superconductor wire 1 has the structure shown in FIG. 1 except for a terminal part at both ends in the longitudinal direction thereof, the terminal part of the oxide superconductor wire 1 having a structure shown in FIGS. 2A and 2B.

In the terminal part of the oxide superconductor wire 1, a sealing material (sealing member) 10 is butt-welded to the end of the superconductor laminate 9, the sealing material having substantially the same width and thickness as the superconductor laminate 9 and formed of a metal tape having a length of approximately 5 mm. The sealing material 10 extends in the longitudinal direction of the superconductor laminate 9. The metal stabilization layer 8 covering the superconductor laminate 9 includes an extension part 8a covering the outer peripheral of the sealing material 10 which protrudes from the end of the superconductor laminate 9. The metal stabilization layer 8 is tightly adhered and joined to the periphery of the sealing material 10 via an extension part 3a of the electrically conductive joint material 3, the extension part arranged on the inner surface of the extension part 8a.

The substrate 2 of the oxide superconductor wire 1 preferably has a tape shape, sheet shape, or plate shape, in order to obtain a flexible and elongated superconductor wire. In addition, the material employed as the substrate 2 preferably contains a metal which has relatively high mechanical strength and heat resistance and can be easily processed into wires. Examples of such materials includes, for example, various kinds of heat-resistance metal materials including a nickel alloy such as stainless steel and HASTELLOY, and materials having ceramics arranged on the various kinds of metal materials. In particular, HASTELLOY (Trade name, HAYNES INT. INC USA), which is known as one kind of nickel alloys, is preferable among commercially available products. Various kinds of HASTELLOY such as HASTELLOY B, C, G, N, and W are available, which contain different amount of ingredients such as molybdenum, chromium, iron, and cobalt. Any of the HASTELLOYs can be used for the substrate 2. The thickness of the substrate 2 may be adjusted in accordance with the purpose, typically be 10 to 500 μm, and preferably be 20 to 200 μm. Alternatively, for the substrate 2, an oriented Ni—W alloy tape substrate may be employed, the substrate being formed by introducing texture into a nickel alloy.

An example of the interlayer 5 may have a configuration in which a foundation layer constituted by a diffusion prevention layer or a bed layer, an orientation layer, and a cap layer are laminated in this order.

The diffusion prevention layer will serve to prevent part of the constituent elements of the substrate 2 from diffusing and being admixed, as impurities, into the oxide superconductor layer 6, when heat treatment is performed to the layers formed above the diffusion prevention layer and, as a result, imparts thermal hysteresis to the substrate 2 and the other layers. The specific structure of the diffusion prevention layer is not particularly limited provided it is capable of providing the above-described effects. It is preferable to employ a diffusion prevention layer having a single-layer or multilayer structure constituted by $Al_2O_3$, $Si_3N_4$, GZO ($Gd_2Zr_2O_7$), or the like, which are relatively effective in preventing the admixture of impurities.

The bed layer is used to prevent reactions of the constituent element at the interface between the substrate 2 and the oxide superconductor layer 6 and improving the orientation of layers which are provided on the bed layer. The specific structure of the bed layer is not particularly limited provided it is capable of providing the above-described effects. It is preferable to employ a bed layer having single-layer or multilayer structure constituted by a rare earth oxide which have high heat resistance, such as $Y_2O_3$, $CeO_2$, $La_2O_3$, $Dy_2O_3$, $Er_2O_3$, $Eu_2O_3$, and $Ho_2O_3$. It may be arranged to provide both of the diffusion prevention layer and the bed layer, provide either one of those, or omit the diffusion prevention layer and the bed layer depending on the constituent materials of the orientation layer.

The orientation layer serves to control the crystal orientation of the cap layer and the oxide superconductor layer 6 which are formed thereon, prevent the constituent elements of the substrate 2 from diffusing into the oxide superconductor layer 6, and mitigate the difference between the substrate 2 and the oxide superconductor layer 6 in terms of physical characteristics such as coefficient of thermal expansion and lattice constant. The material of the orientation layer is not particularly limited provided it is capable of providing the above-described effects. The material is preferably a metal oxide such as $Gd_2Zr_2O_7$, MgO, $ZrO_2$—$Y_2O_3$ (YSZ), and the like. When using such a metal oxide as the material of the orientation layer, an orientation layer having high crystal orientation can be obtained with an ion beam assisted deposition method (hereinafter, may be referred to as IBAD method) which is described later, which will further improve the crystal orientation of the cap layer and the oxide superconductor layer 6 which are formed on the orientation layer.

The cap layer serves to strongly control the crystal orientation of the oxide superconductor layer 6 equally or more than the orientation layer, prevent the constituent elements of the oxide superconductor layer 6 from diffusing into the interlayer 5, and prevent reactions between the interlayer 5 and gases used in the process of laminating the oxide superconductor layer 6.

The constituent material of the cap layer is not particularly limited provided it is capable of providing above-described effects, but is preferably a metal oxide such as $CeO_2$, $Y_2O_3$, $Al_2O_3$, $Gd_2O_3$, $ZrO_2$, $Ho_2O_3$, $Nd_2O_3$, $Zr_2O_3$, and $LMnO_3$ in view of lattice matching with respect to the oxide superconductor layer 6. Of these materials, $CeO_2$ or $LaMnO_3$ are particularly preferable in view of the matching with respect to the oxide superconductor layer 6.

When using $CeO_2$ as the material of the cap layer, the cap layer may include a Ce-M-O based oxide in which part of Ce atoms are substituted with the other metal atoms or metal ions.

The oxide superconductor layer 6 serves to conduct an electric current when it is in a superconducting state. Wide variety of oxide superconductor materials having commonly-known compositions may be employed as the material of the oxide superconductor layer 6. Examples thereof include a copper oxide superconductor such as Y based superconductor. Examples of the composition of the Y based superconductor include $REBa_2Cu_3O_{7-x}$ (RE represents a rare-earth element such as Y, La, Nd, Sm, Er, and Gd while x represents deficient oxygen), more particularly Y123 ($YBa_2Cu_3O_{7-x}$) and Gd123 ($GdBa_2Cu_3O_{7-x}$). With respect to the oxide superconductor, introduction of oxygen through oxygen annealing into its original material, which is an insulator, will give an oxide superconductor having a well-organized crystal structure and exhibiting superconductive properties. In order to obtain the oxide superconductor layer 6 exhibiting excellent crystal orientation, it is necessary to form the oxide superconductor layer 6 on a cap layer which exhibits excellent crystal orientation.

The oxide superconductor wire 1 with the oxide superconductor layer 6 having excellent crystal orientation will exhibit excellent critical current characteristics when electric current is applied thereto at a temperature equal to or less than the critical temperature.

The protection layer 7 serves as an electric current path which bypasses overcurrent generated due to some sort of fault when electric current is applied to the oxide superconductor wire 1. In addition, the protection layer 7 has oxygen permeability when it is heated, which allows oxygen to be easily introduced into the oxide superconductor layer 6. In this regard, it is preferable that the protection layer 7 be formed of Ag or other materials including at least Ag.

Alternatively, the material of the protection layer 7 may be a mixture or an alloy containing a rare metal such as Au and Pt, or a combination of these. It should be noted that the protection layer 7 may be formed so as to cover the entire periphery of the superconductor laminate 9, that is, the entire periphery of the laminate including the substrate 2, the interlayer 5, and the oxide superconductor layer 6.

In the present embodiment, the metal stabilization layer 8 including the extension part 8a is arranged so as to cover the superconductor laminate 9 and the sealing material 10. Functions required to the metal stabilization layer 8 depend on the intended use of the oxide superconductor wire 1.

For example, when using the oxide superconductor wire 1 in a superconductor cable or a superconductor motor, the metal stabilization layer 8 is required to serve as a key part of a bypass to commutate overcurrent caused by a quench which occurs when the oxide superconductor layer 6 transitions to a normal conducting state due to some sort of fault. In this case, it is preferable that the material of the metal stabilization layer 8 be a relatively inexpensive material such as copper, copper alloy such as Cu—Zn alloy (brass) and Cu—Ni alloy, aluminum, aluminum alloy, and stainless steel. Of these, a copper is preferable because it has high electrical conductivity and is inexpensive.

On the other hand, when using the oxide superconductor wire 1 in a superconductor current limiter, the metal stabilization layer 8 is required to serve to instantaneously reduce overcurrent caused by a quench which occurs when the oxide superconductor layer 6 transitions to a normal conducting state. In this case, examples of the material of the stabilization layer 8 include, for example, a high resistant metal such as a Ni-based alloy including Ni—Cr.

The metal stabilization layer 8 is formed from metal tape having a predetermined width and folded so as to cover the superconductor laminate 9 from the front face of the protection layer 7 to the back face of the substrate 2, and thus have substantially a C shape in view of the lateral cross section.

The sealing material 10 is preferably made of a metal material equivalent to the metal material constituting the substrate 2 or a metal material capable of being tightly adhered by welding to the metal material constituting the substrate 2. In addition, the sealing material 10 is preferably made of a material which has good adhesiveness to the electrically conductive joint material 3 such as solder. In view of the above, examples of the constituent material of the sealing material 10 include a metal material such as stainless steel, Ni-based alloy, and Cu-based alloy. If solder is used as the material of the electrically conductive joint material 3 and a metal material not capable of adhering to solder is used as the material of the sealing material 10, it is preferable to coat the metal material in advance with a material capable of tightly adhering to solder such as Sn and Ag.

Examples of a tin alloy, such as solder, constituting the electrically conductive joint material 3 including the extension part 3a include: lead-free solder made of a Sn-based alloy such as Sn, Sn—Ag-based alloy, Sn—Bi-based alloy, Sn—Cu-based alloy, and Sn—Zn-based alloy; Pb—Sn based alloy solder; eutectic solder; and low temperature solder. It may be arranged such that a combination of one or more of these solders is used as the material of the electrically conductive joint material 3.

Figure 2A:
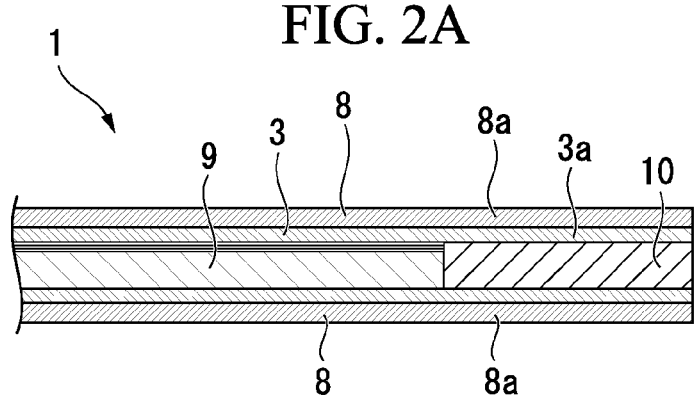
FIG. 2A is a vertical cross-sectional view showing a structure of the terminal part of the oxide superconductor wire.
Figure 2B:
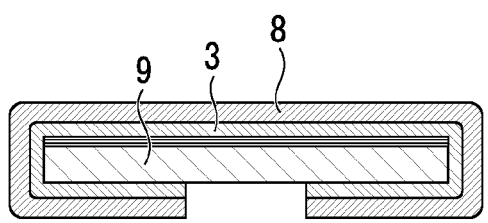
FIG. 2B is a fragmentally sectional view showing a structure of the terminal part of the oxide superconductor wire.

In the oxide superconductor wire 1 shown in FIGS. 2A and 2B, the terminal part of the superconductor laminate 9 is provide with the sealing material 10 and the sealing material 10 seals the terminal part of the superconductor laminate 9. In addition, the extension part 3a of the electrically conductive joint material 3 and the extension part 8a of the metal stabilization layer 8 are tightly adhered to the outer periphery of the sealing material 10 to cover the outer periphery of the sealing material 10. Therefore, it is possible to prevent moisture from intruding from the terminal part. Accordingly, in the oxide superconductor wire 1, it is possible to prevent deterioration of the oxide superconductor layer 6 due to moisture intruding from the terminal part.

Moreover, since the extension part 3a of the electrically conductive joint material 3 made of solder or the like is arranged between the sealing material 10 and the extension part 8a of the metal stabilization layer 8 and solder is capable of tightly adhering to the sealing material 10 and the extension part 8a, the sealing material 10 and the extension part 8a of the metal stabilization layer 8 are mutually tightly adhered without a gap therebetween to cover the sealing material 10, and, as a result, it is possible to prevent moisture intrusion.

In addition, since the sealing material 10 has a sufficient length to seal the terminal part of the oxide superconductor wire 1 in the region in which the extension part 3a of the electrically conductive joint material 3 and the extension part 8a of the metal stabilization layer 8 are formed, it is possible to effectively seal the terminal of the oxide superconductor wire 1. The length of the sealing material 10 is preferably no less than 5 mm to ensure the sufficient area of the extension part 3a of the electrically conductive joint material 3 to prevent moisture intrusion. If the length of the sealing material 10 is less than 5 mm, partial adhesion failure may occur in the extension part 3a of the electrically conductive joint material 3 and the part may become a path through which moisture intrudes. The length of the sealing material 10 needs to be no less than 5 mm such that no moisture intrusion path is not formed in the extension part 3a.

Figure 3A:
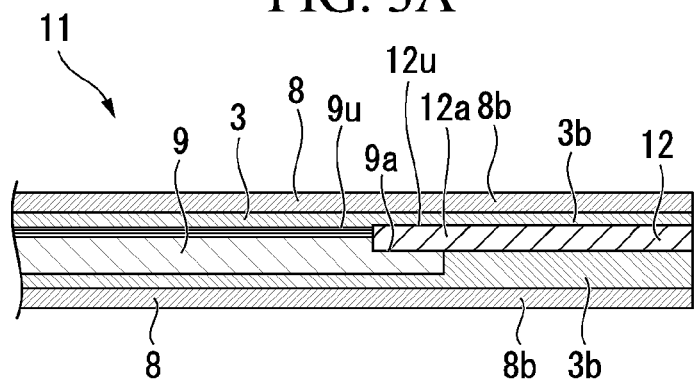
FIG. 3A is a vertical cross-sectional view showing an oxide superconductor wire according to the second embodiment.
Figure 3B:
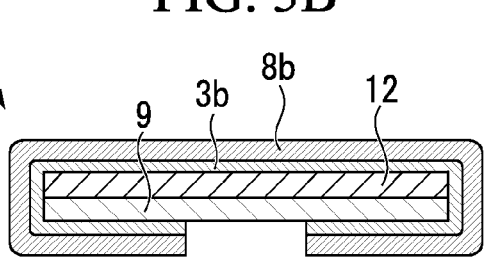
FIG. 3B is a fragmentally sectional view showing an oxide superconductor wire according to the second embodiment.

FIGS. 3A and 3B show an oxide superconductor wire 11 according to the second embodiment. The oxide superconductor wire 11 is equal in structure to the oxide superconductor wire 1 according to the first embodiment in that the substrate 2, the interlayer 5 laminated on the substrate 2, the oxide superconductor layer 6, and the protection layer 7 form the superconductor laminate 9, and the outer periphery of the superconductor laminate 9 is covered with the metal stabilization layer 8. The oxide superconductor wire 11 is different in structure from the oxide superconductor wire 1 according to the first embodiment in that a recess 9a is formed in the terminal part of the superconductor laminate 9, the end 12a of the sealing material 12 is connected to the recess 9a by spot welding, and the sealing material 12 is covered with the extension part 8b of the metal stabilization layer 8 via the extension part 3b of the electrically conductive joint material 3.

The recess 9a of the superconductor laminate 9 is formed by partially removing the protection layer 7, the oxide superconductor layer 6, the interlayer 5, and the top portion of the substrate 2 by grinding or the like. The end 12a of the sealing material 12, which is made of the same material as that of the sealing material 10 of the oxide superconductor wire 1 according to the first embodiment, is placed on the recess 9a and the recess 9a and the end 12a are joined together by a joining method such as spot welding to integrate the superconductor laminate 9 with the sealing material 12.

A difference in level may appear between the end 12a of the sealing material 12 and the end of the superconductor laminate 9 when the end 12a of the sealing material 12 is placed on the recess 9a. It is preferable to determine the height of the recess 9a so as to minimize the difference in level. In this point of view, it is preferable that the height of the recess 9a be substantially the same as the thickness of the sealing material 12. Alternatively, it is preferable to determine the thickness of the sealing material 12 such that the amount of the portion of the superconductor laminate 9 protruded from the upper face 9a of the sealing material 12 is no more than a tolerance. The tolerance is the maximum value of the protruded amount tolerable for the extension part 3b of the electrically conductive joint material 3 to sufficiently infill the difference in level between the upper face 9u of the superconductor laminate 9 and the upper face 12u of the end 12a of the sealing material 12 to prevent moisture intrusion.

As explained above, the sealing material 12 is welded to the recess 9a so as to extend in the longitudinal direction of the superconductor laminate 9 and be joined to the terminal part of the superconductor laminate 9. Further, the connection part and the peripheral surface of the sealing material 12 are covered with the extension part 8b of the metal stabilization layer 8 via the extension part 3b of the electrically conductive joint material.

In the oxide superconductor wire 11 according to the second embodiment shown in FIGS. 3A and 3B, the same advantageous effects can be obtained as the above-described oxide superconductor wire 1 according to the first embodiment. That is, as with the oxide superconductor wire 1, since the extension part 3b of the electrically conductive joint material 3 and the extension part 8b of the metal stabilization layer 8 are tightly adhered to the outer periphery of the sealing material 12 to cover the outer periphery of the sealing material 12, it is possible to prevent moisture from intruding from the terminal part, and thus prevent deterioration of the oxide superconductor layer 6 due to moisture.

Figure 4:
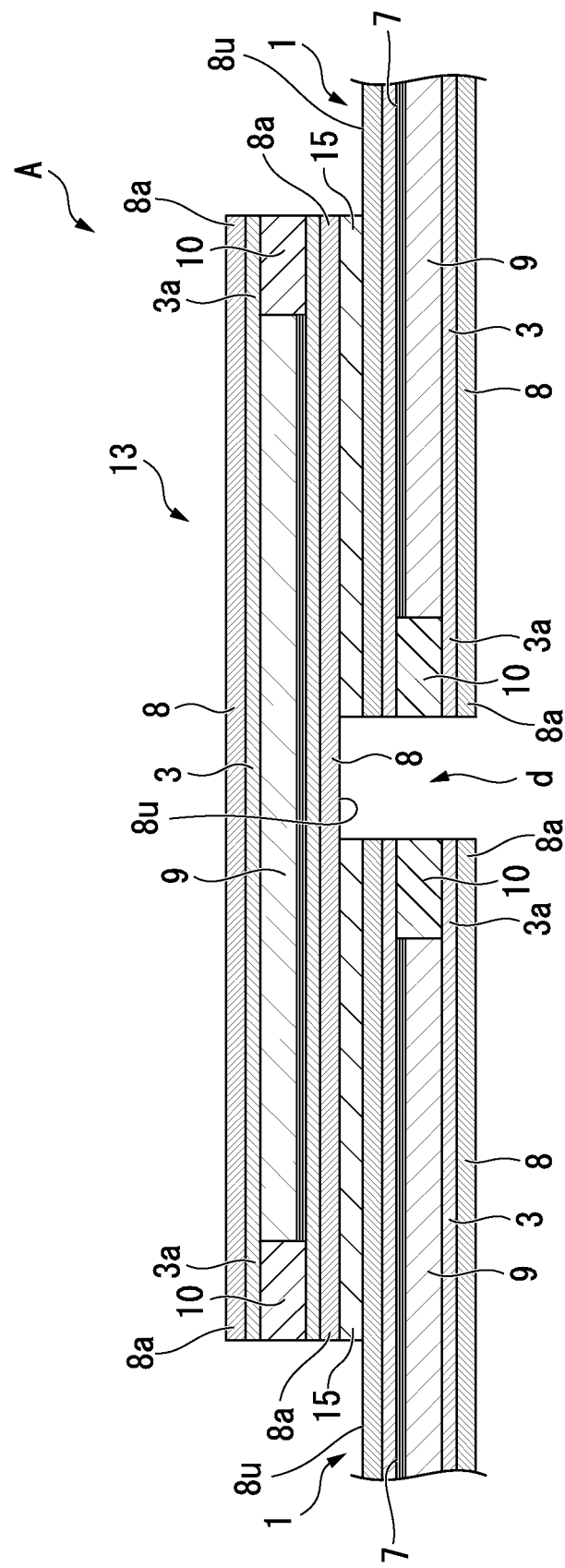
FIG. 4 is a vertical cross-sectional view showing the first example of a structure for connecting a plurality of oxide superconductor wire according to the first embodiment.

FIG. 4 shows an example of a structure for connecting the above-described oxide superconductor wire 1. The connection structure A of this example may be applied when connecting two of the oxide superconductor wire 1 shown in FIG. 1 with each other.

As shown in FIG. 4, the two oxide superconductor wires 1 are adjacent to each other such that these end faces oppose to each other with a gap d therebetween. In addition, the two oxide superconductor wires 1 are arranged in line such that the positional relationship between the substrate 2 and the protection layer 7 in the thickness direction of the substrate 2 is the same between the two oxide superconductor wires 1. In the example of FIG. 4, in each oxide superconductor wire 1, the protection layer 7 is arranged above the substrate 2. A third oxide superconductor wire 13 is arranged so as to bridge between the two oxide superconductor wires 1, 1 and is adhered to the two oxide superconductor wires 1, 1. For the purpose of explanation, one of the mutually connected oxide superconductor wires 1, 1 (lower (left) one in FIG. 4) will be referred to as the first oxide superconductor wire 1, while the other (upper (right) one in FIG. 4) will be referred to as the second oxide superconductor wire 1.

The third oxide superconductor wire 13 has an equal structure to the first and second oxide superconductor wires 1, but is a short-length tape-shaped oxide superconductor wire. That is, the third oxide superconductor wire 13 includes: the superconductor laminate 9 including the substrate 2 as well as the interlayer 5, the oxide superconductor layer 6, and the protection layer 7 which are laminated on the substrate 2; and the metal stabilization layer 8 covering the peripheral surface of the superconductor laminate 9, but the length thereof is, for example, around several cm to several tens cm, more specifically around 1 cm to 20 cm depending on a target to be connected.

The third oxide superconductor wire 13 is arranged such that the protection layer 7 arranged thereinside opposes to the protection layer 7 of the first and the second oxide superconductor wires 1, 1 and the metal stabilization layer 8 thereof extends along the metal stabilization layer 8 of the first and the second oxide superconductor wires 1, 1; and connected to the first and the second oxide superconductor wires 1, 1 with an electrically conductive joint material (the third and the fourth electrically conductive joint materials) 15 such as solder or the like which are arranged between these metal stabilization layers 8. That is, the upper face 8u of the metal stabilization layer 8 of the third oxide superconductor wire 13 and the upper face 8u of the metal stabilization layer 8 of the first and the second oxide superconductor wires 1, 1 overlap each other, oppose to each other, and joined together with the electrically conductive joint material 15.

According to the connection structure A shown in FIG. 4, the terminal part of the first and the second oxide superconductor wires 1, 1 and the terminal part of the third oxide superconductor wire 13 located at the connection part have a terminal sealed structure using the sealing material 10. Accordingly, at the connection part of the connection structure shown in FIG. 4 and its periphery, it is possible to prevent deterioration of the oxide superconductor layer 6 due to moisture.

Figure 5:
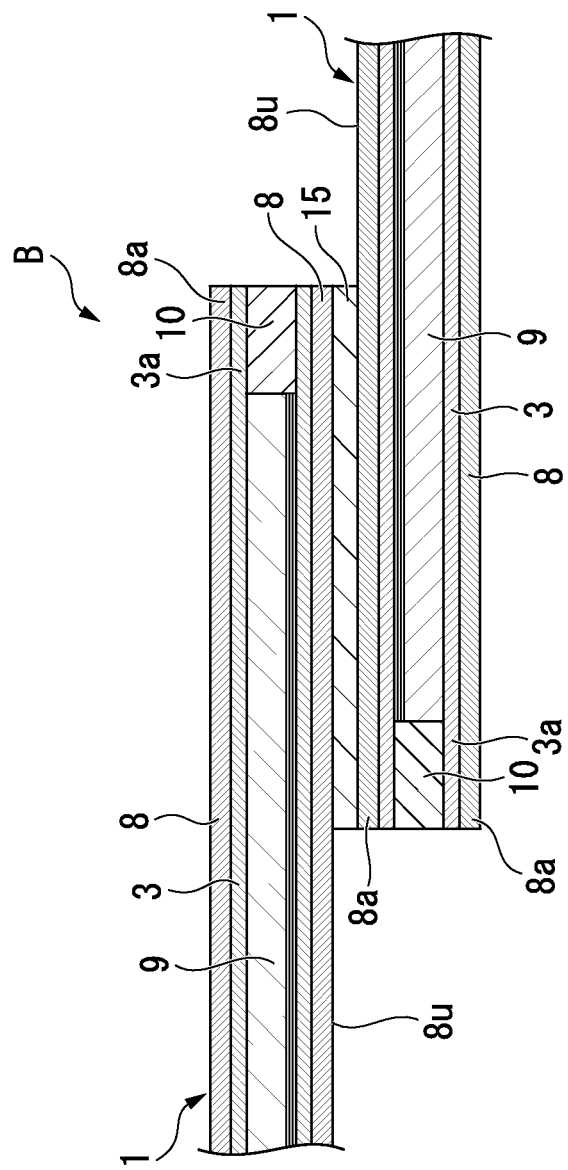
FIG. 5 is a vertical cross-sectional view showing the second example of a structure for connecting a plurality of oxide superconductor wire according to the first embodiment.

FIG. 5 shows another example of a structure for connecting the above-described oxide superconductor wire 1. A connection structure B of this example may be applied when directly connecting two of the oxide superconductor wire 1 shown in FIG. 1.

In FIG. 5, the first and the second oxide superconductor wires 1 are arranged such that these ends overlap each other over a predetermined length and joined together with an electrically conductive joint material (the second electrically conductive joint material) 15 such as solder. The first and the second oxide superconductor wires 1 are arranged such that their protection layers 7 oppose to each other while sandwiching the electrically conductive joint material 15, and the mutually opposed metal stabilization layers 8 are connected with the electrically conductive joint material 15. In other words, the upper face 8u of the metal stabilization layer 8 of the first oxide superconductor wire 1 and the upper face 8u of the metal stabilization layer 8 of the second oxide superconductor wire 1 overlap each other, oppose to each other, and joined together with the electrically conductive joint material 15.

In the connection structure B of the example, the front-and-back relationship is reversed between the first and second oxide superconductor wires 1 in the joint part, and thus this structure may be applied in a case where the reversed front-and-back relationship between the first and second oxide superconductor wires 1 in the joint part does not cause trouble.

<Superconductor Cable>

Figure 6:
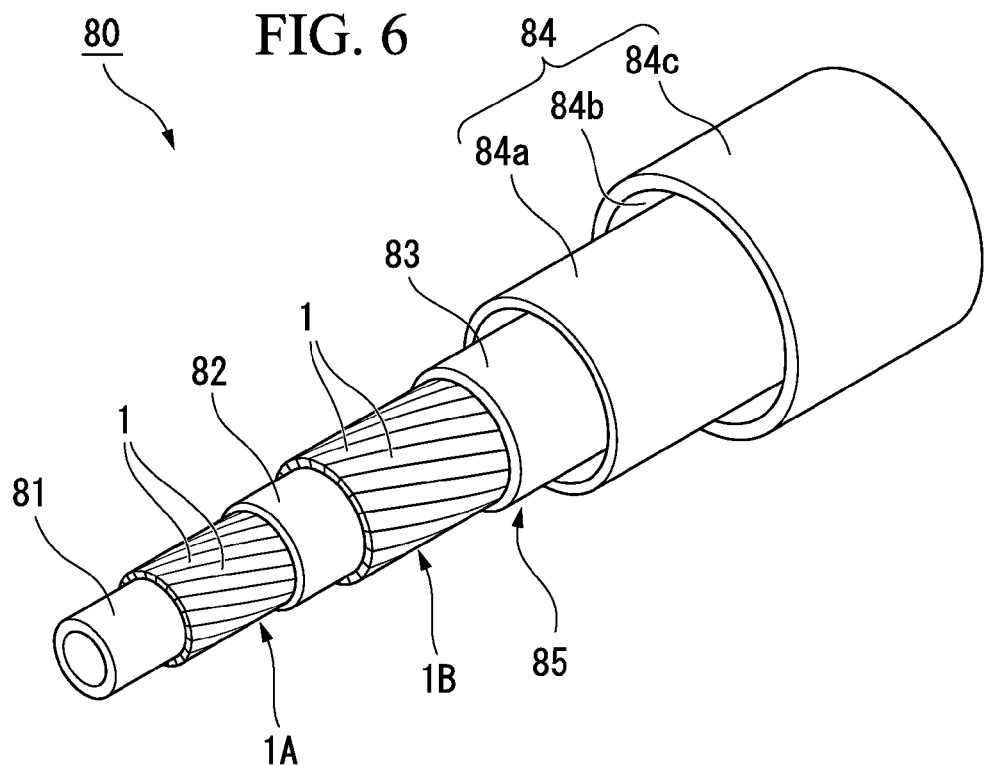
FIG. 6 is a perspective view showing an example of a superconductor cable including an oxide superconductor wire of which the terminal is sealed.

The oxide superconductor wires 1, 11 shown in FIGS. 2A-3B and the connection structures A, B of the oxide superconductor wires 1, 11 shown in FIGS. 4-5 may be applied, for example, to a high-temperature superconductor cable 80 exemplarily shown in FIG. 6. In the high-temperature superconductor cable 80 shown in FIG. 6, a former 81 arranged in the center and a multilayered oxide superconductor wire 1 arranged around the outer periphery of the former 81 in a winding manner form a superconductor layer 1A, and the superconductor layer 1A, an insulation layer 82 formed around the outer periphery of the super conductor layer 1A, a superconductor shield layer 1B, and a protection layer 83 form a core cable 85. The core cable 85 is housed inside a heat insulation pipe 84 with leaving a gap for coolant flow. The heat insulation pipe 84 has, for example, a double pipe structure including an inner pipe 84a and an outer pipe 84c. A vacuum heat insulation layer 84b is formed between the inner pipe 84a and the outer pipe 84c. The superconductor shield layer 1B is constituted by a multilayered oxide superconductor wire 1 formed in a winding manner.

Using the high-temperature superconductor cable 80 as a long-length cable will require a structure for connecting the oxide superconductor wire 1 forming the superconductor layer 1A and the oxide superconductor wire 1 constituting the superconductor shield layer 1B with the other superconductor cable, and further require a structure for sealing the terminal.

In this regard, the oxide superconductor wires 1, 11 having a terminal sealing structure shown in FIGS. 2A-3B and the connection structures A, B of the oxide superconductor wires 1, 11 shown in FIGS. 4-5 may be applied.

<Superconductor Current Limiter>

Figure 7:
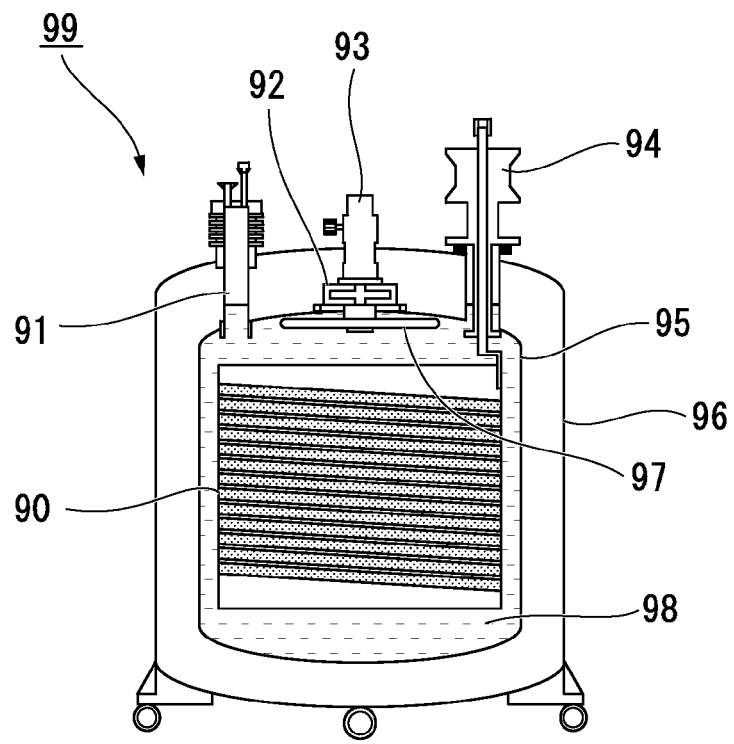
FIG. 7 is a perspective view showing an example of a superconductor current limiter including an oxide superconductor wire of which the terminal is sealed.

The oxide superconductor wires 1, 11 shown in FIGS. 2A-3B of which the terminal is treated and the connection structures A, B of the oxide superconductor wires 1, 11 shown in FIGS. 4-5 may be applied, for example, to a superconductor current limiter 99 shown in FIG. 7.

In the superconductor current limiter 99 shown in FIG. 7, the oxide superconductor wires 1, 11 having a terminal sealing structure shown in FIGS. 2A-3B or the oxide superconductor wires 1, 11 having a terminal connection structure A, B shown in FIGS. 4-5 is wound in plural layers around a drum to constitute superconductor current limiter module 90. The module 90 for a superconductor current limiter is housed in a liquid nitrogen tank 95 which is filled with liquid nitrogen 98. The liquid nitrogen tank 95 is housed inside a vacuum tank 96 which keeps out heat from outside.

A liquid nitrogen supply part 91 and a refrigerator 93 are provided on top of the liquid nitrogen tank 95. A heat anchor 92 and a heat plate 97 are provided under the refrigerator 93.

In addition, the superconductor current limiter 99 includes a current lead part 94 for connecting the module 90 for a superconductor current limiter with an external power source (not shown in the figures).

When using oxide superconductor wires 1, 11 in the above-described superconductor current limiter module 90 of the superconductor current limiter 99, a high resistant metal such as Ni—Cr will be employed as the metal stabilization layer 8, as previously explained.

<Superconductor Motor>

Figure 8A:
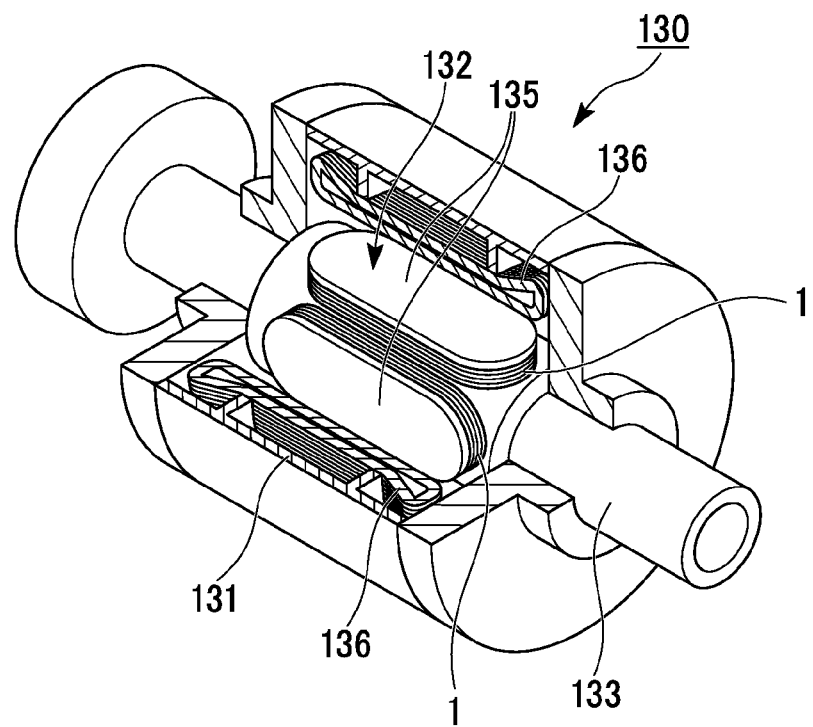
FIG. 8A is a perspective view showing an example of a superconductor motor including an oxide superconductor wire of which the terminal is sealed.
Figure 8B:
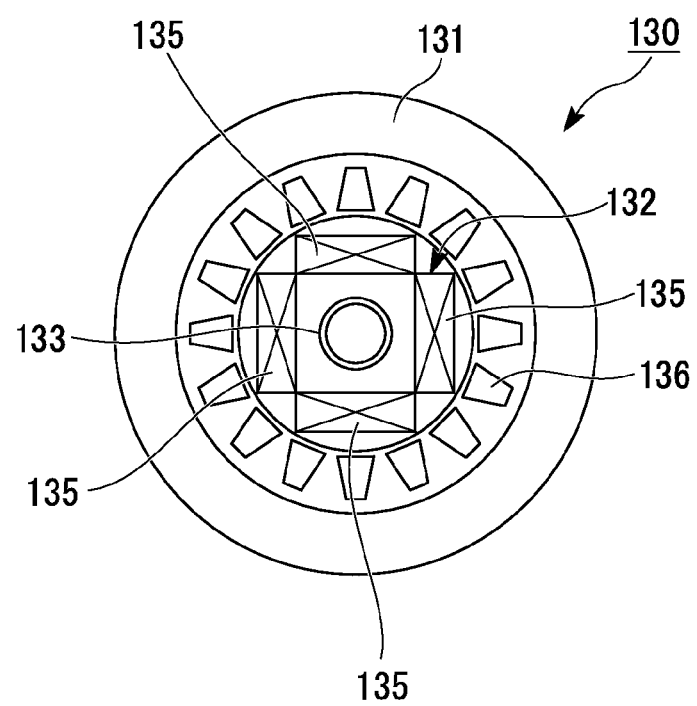
FIG. 8B is a perspective view showing an example of a superconductor motor including an oxide superconductor wire of which the terminal is sealed.

The oxide superconductor wires 1, 11 shown in FIGS. 2A-3B of which the terminal is treated and the connection structures A, B of the oxide superconductor wires 1, 11 shown in FIGS. 4-5 may be applied to a superconductor motor 130 shown in FIGS. 8A and 8B.

The superconductor motor 130 includes an axial rotor 132 of which the axis is rotatably supported inside a cylindrical and sealed container 131.

A plurality of coil 135 for a superconductor motor are attached to the peripheral surface of the rotation axis 133. A plurality of normal conductor coil 136 supported by the inner wall of the container 131 and formed from a copper coil are arranged around the plurality of coil 135 for a superconductor motor.

In the coils 135 for a superconductor motor, the oxide superconductor wire 1, 11 shown in FIGS. 2A-3B of which the terminal is treated or an oxide superconductor wire 1, 11 having the connection structure A or B of the oxide superconductor wire 1, 11 shown in FIGS. 4-5 is wound around a racetrack shaped bobbin.

A plurality of pipe for introducing or ejecting a cooling gas are arranged inside the rotation axis 133. Through these pipes, a cooling gas can be introduced into the container 131 from a coolant supplier which is externally and separately provided and not shown in the figures, and the coils 135 for a superconductor motor can be cooled with the cooling gas down to a temperature equal to or less than the critical temperature. It should be noted that the coils 135 for a superconductor motor are cooled down to a temperature equal to or less than the critical temperature but the normal conductor coils 136 function as a normal temperature part when the superconductor motor 130 is in operation.

When the superconductor motor 130 shown in FIGS. 8A and 8B is in operation, a cooling gas is introduced into the container 131 and the coils 135 for a superconductor motor are cooled with the cooling gas down to a temperature equal to or less than the critical temperature. Necessary electric current is separately supplied to the normal conductor coils 136 from a power source which is not shown in the figures while necessary electric current is separately supplied to the coils 135 for a superconductor motor from a power source which is not shown in the figures, which will rotate the rotation axis 133 by a rotational power due to the magnetic field generated by both coils.

<Superconductor Coil>

Figure 9A:
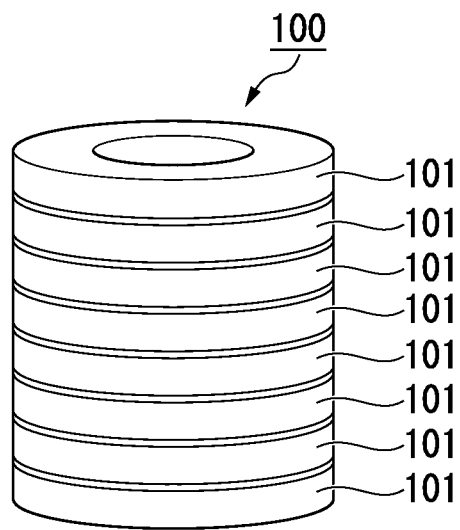
FIG. 9A is a perspective view showing an example of a superconductor coil including an oxide superconductor wire of which the terminal is sealed.
Figure 9B:
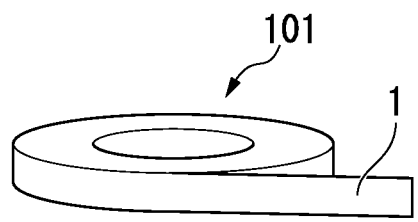
FIG. 9B is a perspective view showing an example of a superconductor coil including an oxide superconductor wire of which the terminal is sealed.

The oxide superconductor wires 1, 11 shown in FIGS. 2A-3B of which the terminal is treated and the oxide superconductor wires 1, 11 having the connection structure A or B shown in FIGS. 4-5 may be applied to a pancake-shape superconductor coil 101 shown in FIG. 9B. Further, by stacking plural superconductor coils 101 and connecting them with one another, it may form a superconductor coil 100 shown in FIG. 9A which will generate strong magnetic force.

As is explained above, the oxide superconductor wires 1, 11 shown in FIGS. 2A-3B of which the terminal is treated and the connection structures A, B of the oxide superconductor wires 1, 11 shown in FIGS. 4-5 may be applied to various superconductor equipment.

It should be noted that the superconductor equipment is not particularly limited provided it includes the oxide superconductor wire 1, and examples thereof include superconductor cable, superconductor motor, superconductor current limiter, superconductor coil, superconductor transformer, and superconductor electricity storage.

<Manufacturing Method of Superconductor Wire>

Hereinbelow, an example of a manufacturing method of a oxide superconductor wire 1 will be explained.

First, the diffusion prevention layer and the bed layer are formed as necessary on the surface of the tape-shaped substrate 2, and then, the orientation layer and the cap layer are formed thereon, and the oxide superconductor layer 6 and the protection layer 7 are formed thereon to obtain the oxide superconductor laminate 9.

The diffusion prevention layer and the bed layer may be formed by a commonly-known method such as a sputtering method because they are not required to have a certain crystallinity. The orientation layer is preferably formed by the IBAD method which allows the orientation layer to highly control the crystal orientation of the oxide superconductor layer 6 and the cap layer. It should be noted that the IBAD method refers to a method of delivering an ion beam such as Ar during the film formation at a predetermined incident angle to the surface on which the crystal is formed, which allows the crystal axes to be oriented.

Then, the cap layer is formed on the orientation layer by a pulse laser deposition method or the like and the oxide superconductor layer 6 is formed on the cap layer. In the above-described steps, if the orientation layer and the cap layer are formed so as to exhibit an excellent orientation, the crystal grain of the oxide superconductor formed on the cap layer will exhibit an excellent orientation, and thus the oxide superconductor layer 6 exhibiting excellent superconductive properties will be obtained. Consequently, the protection layer 7 is formed on the oxide superconductor layer 6. The protection layer 7 may be formed by a sputtering method. The film thickness of the protection layer 7 may be normally 1 to 30 μm. It may be arranged such that the protection layer 7 covers the entire periphery of the laminate formed from: the substrate 2; and the diffusion prevention layer, the bed layer, the orientation layer, the cap layer, and the oxide superconductor layer 6 on the substrate 2.

Then, the above-described oxide superconductor laminate 9 is subjected to an oxygen anneal treatment in which oxygen is supplied to the original material of the oxide superconductor layer 6 using a furnace not shown in the figures. This allows the crystal structure of the oxide superconductor layer 6 to be organized, and thus the oxide superconductor layer 6 made of a crystal of the oxide superconductor and exhibiting excellent superconductive properties is obtained. With regard to the conditions of the oxygen anneal treatment, the heat temperature of 300-500° C. and the heat duration of several hours to several tens hours may be employed.

Then, the sealing material 10 formed from metal tape having substantially the same width and thickness as the superconductor laminate 9 is butt-welded to the terminal part of the superconductor laminate 9 after the oxygen anneal treatment such that the sealing material 10 extends from the superconductor laminate 9 in its longitudinal direction. After that, the stabilizer formed from the metal tape is shaped by a roll forming and adhered to the superconductor laminate 9 to form the metal stabilization layer 8 covering the outer periphery of the superconductor laminate 9. The metal tape constituting the metal stabilization layer 8 has a width approximately twice the superconductor laminate 9 and made of copper or the like. In addition, it may be arranged to use metal tape of which one surface is coated with an electrically conductive joint material made of a low melting point metal such as Sn and having a thickness of approximately 2-4 μm. The film thickness of the metal stabilization layer 8 is not particularly limited, and may be appropriately adjusted. With the consideration of the flexibility of the oxide superconductor wire 1, the film thickness of the metal stabilization layer 8 is preferably 10-300 μm.

Figure 10:
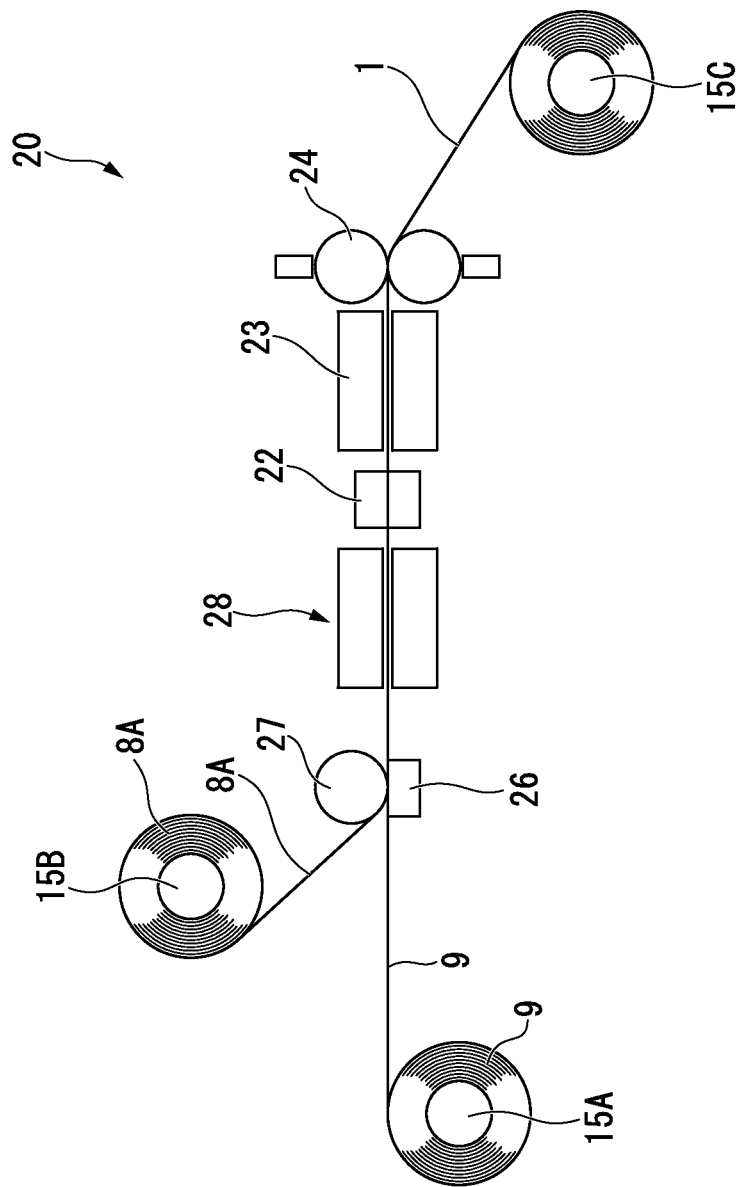
FIG. 10 is a block diagram showing an example of an apparatus of manufacturing an oxide superconductor wire according to the first embodiment.

FIG. 10 shows an example of an apparatus for manufacturing the oxide superconductor wire 1 using a roll forming method. The manufacturing apparatus 20 of this example includes a folding mechanism 22, a heating mechanism 23, and a pressure roll 24.

The tape-shaped superconductor laminate 9 is wound to a first feeder reel 15A while a metal tape 8A being wider than the superconductor laminate 9 is wound to a second feeder reel 15B. The metal tape 8A (one face coated with a plated layer of an electrically conductive joint material) is overlaid to the superconductor laminate 9 fed from the first feeder reel 15A by an electric conductor overlay mechanism 26 and a conveyance roller 27. The wide-width metal tape 8A overlaid to the superconductor laminate 9 is plastically processed by a laminate mechanism 28 and the folding mechanism 22 so as to form a C shape in the lateral cross-sectional view and surround the outer periphery of the superconductor laminate 9.

After that, the heat mechanism 23 heats the metal tape 8A up to a temperature near the melting point of a tin or a tin alloy to melt the electrically conductive joint material. The metal tape 8A is shaped into the stabilization layer 8 and soldering is performed when the metal tape 8A surrounding the outer periphery of the superconductor laminate 9 passes through the pressure roll 24 with the electrically conductive joint material being melted. The superconductor laminate 9 surrounded by the metal stabilization layer 8 is pulled out from the pressure roll 24 and wound to a wind-up roll 15C. Through the above-describe steps, the oxide superconductor wire 1 will be obtained in which the periphery of the superconductor laminate 9 is covered with the stabilization layer 8 and the electrically conductive joint material 3 fills the gap between the superconductor laminate 9 and the stabilization layer 8, of which the cross section is shown in FIG. 1.

Alternatively, with the tape-shaped superconductor laminate 9 of which the head end and the tail end are joined to the sealing material 10 in advance by a joining means such as welding and which is wound to the first feeder reel 15A, it is possible through the above-described roll forming method to manufacture the oxide superconductor wire 1 having a structure in which the terminal part is sealed.

EXAMPLE

Hereinafter, embodiments of the present invention will be explained in detail with examples, but the present invention is not limited to the following examples.

Example 1

A plurality of tape-shaped substrate made of HASTELLOY (Trade name HASTELLOY C-276, HAYNES INT. INC., USA) and having a width of 5 mm, a thickness of 100 μm, and a length of 50 m were prepared, the surface of each substrates was polished, and then each substrate was cleaned with alcohol and organic solvent.

Then, the diffusion prevention layer, the bed layer, the orientation layer, and the cap layer were formed in this order on the surface of the substrates. In the process of forming each layer, inside a film formation apparatus provided with a feeder reel and a winder reel for conveying a tape-shaped substrate, each layer was formed in series on the substrate while conveying the substrate at a predetermined speed. Each layer was formed with the following conditions.

First, a diffusion prevention layer made of $Al_2O_3$ and having a thickness of 100 nm was formed on the tape-shaped substrate by an ion beam sputtering method, and then, a bed layer made of $Y_2O_3$ and having a thickness of 20 nm was formed on the diffusion prevention layer by an ion beam sputtering method.

After that, an orientation layer made of MgO and having a thickness of 10 nm was formed on the bed layer by the IBAD method.

A cap layer made of $CeO_2$ and having a thickness of 400 nm was formed on the orientation layer by a PLD method, an oxide superconductor layer having a composition represented by $YBa_2Cu_3O_{7-x}$ was formed on the cap layer, and additionally a protection layer of Ag having a thickness of 2 μm was formed on the oxide superconductor layer by a sputtering method, and thereby a laminate was obtained. The laminate was subjected to the oxygen anneal treatment under oxygen atmosphere at 500° C. for 10 hours, and thereby the oxide superconductor laminate was obtained.

The sealing material made of stainless steel having a thickness of 150 μm, a width of 5 mm, and a length of 5 mm was joined to both ends of the oxide superconductor laminate by butt-welding. In addition, a Sn plate layer having a thickness of 2 μm was formed on both surfaces of the sealing material.

Then, metal tape having a width of 8 mm and made of Cu of which one surface is plated with 2 μm-thick Sn was folded in a C shape by a roll forming method using the apparatus shown in FIG. 10 and adhered to the outer periphery of the laminate. During the roll forming, the plated Sn was heated up to approximately 200° C. using a furnace and melted, and thereby an oxide superconductor wire was obtained which has a structure in which the outer periphery of the oxide superconductor laminate is covered with the metal stabilization layer of Cu via the Sn layer.

The sealing material was welded to and formed at both ends of the oxide superconductor laminate so as to extend in the longitudinal direction of the oxide superconductor, and each sealing material was covered with the metal stabilization layer of Cu via the Sn layer. The oxide superconductor wire of the present example has a "butt-joint structure" in which the superconductor laminate and the sealing material are butt joined together.

Example 2

An oxide superconductor wire according to Example 2 was obtained through the process as with Example 1, except for the connection method between the superconductor laminate and the sealing material. In the present example, a recess was formed in the terminal part of the superconductor laminate, and the end of the sealing material was connected to the recess by spot welding. In other words, an oxide superconductor wire having an "overlay welded structure" was obtained in which the superconductor laminate and the sealing material are overlaid together.

Comparative Example 1

An oxide superconductor wire according to Comparative example 1 was obtained through the process as with Example 1, except for the sealing material not connecting to the superconductor laminate. In the present comparative example, the oxide superconductor wire was manufactured without performing specific terminal sealing of the superconductor laminate.

Screening by liquid penetrant test was performed to the obtained oxide superconductor wires. In the liquid penetrant test, after pouring liquid penetrant to a measurement target and wiping it off, liquid developer was poured to the measurement target and then whether or not red-colored liquid was present was visually observed.

If there is a gap between the metal tape and the superconductor laminate/sealing material due to insufficient filling of the melted Sn at the end of the metal tape arranged in the center of the back face of the substrate, the penetrant will enter the gap and remain. If the remaining penetrant in the gap reacts with the subsequently poured liquid developer, red-colored liquid will be visually observed.

In the present examples, COLOR CHECK (TASETO Co., Ltd.) was used as the liquid penetrant.

In addition, each sample was subjected to the pressure cooker test (PCT) in which they were exposed to high temperature (121° C.), high humidity (100%), and high pressure (0.2 MPa) for 100 hours, and the critical current density value before and after the test were measured. With the ratio of the post-exposure critical current density value (Ic) to the pre-exposure critical current density value ($Ic_0$) referred to as $Ic/Ic_0$, it was determined that the samples having $Ic/Ic_0$ of 1 were passed while the samples having $Ic/Ic_0$ of no more than 0.7 were failed.

The following Table 1 shows the results of the above-described tests.

TABLE 1

| | Structure | Screening test | PCT test |
| --- | --- | --- | --- |
| Comparative Example 1 | Without terminal sealing | — | X |
| Example 1 | Butt welded structure | ◯ | ◯ |
| Example 2 | Overlay welded structure | Δ | ◯ |

It should be noted that, in the results of the screening test shown in Table 1, "◯" represents that no red-colored liquid was observed, "Δ" represents that the red-colored liquid was partly observed, and "–" represents that no test was performed. As for the results of PCT test, "O" represents pass while "X" represents failure.

As shown in Table 1, excellent results were obtained for the sample of Example 1 in the screening test. It should be noted that, for the sample of Example 2 having an "overlay welded structure", although the results of the liquid penetrant test are slightly worse compared to the sample of Example 1 due to the difference in level between the superconductor laminate and the sealing material, the sample of Example 2 passed the PCT test. Therefore, as for the sample of Example 2 as well, it was observed that the prevention of moisture intrusion from the terminal part was sufficiently obtained.

From the comparison between Example 1 and Example 2, it can be said that the "butt welded structure" is more advantageous than the "overlay welded structure". In the sample of Example 2 having the "overlay welded structure", gaps were partly made at the end of the metal tape formed with the roll forming method. However, it can be understood that the sample of Example 2 passed the PCT test because the gaps were present only on the back face of the substrate and the inside of the metal stabilization layer formed from the metal tape was filled with the electrically conductive joint layer.

Further, oxide superconductor wires of which the terminal is treated were manufactured in the same way using a sealing material having a length of 3 mm which is less than the above-described sealing material having a length of 5 mm and were subjected to the pressure cooker test. Two of the five manufactured samples showed the deterioration in Ic through the PCT test.

It is considered important that the inside of the metal stabilization layer is filled with the electrically conductive joint material made of a Sn filler, and thus it is understood that the length of the sealing material including the welded part requires to be no less than 5 mm.

INDUSTRIAL APPLICABILITY

According to the embodiments of the present invention, it is possible to provide an oxide superconductor wire in which deterioration due to moisture intrusion hardly occurs in the terminal part, and a connection structure using the oxide superconductor wire. In addition, it is possible to provide a superconductor equipment in which deterioration due to moisture intrusion hardly occurs.

DESCRIPTION OF THE REFERENCE SYMBOLS

1 Oxide superconductor wire
2 Substrate
3 Electrically conductive joint material
3a Extension part
5 Interlayer
6 Oxide superconductor layer
7 Protection layer
8 Metal stabilization layer
8a Extension part
9 Superconductor laminate
10 Sealing material
12 Sealing material
13 Superconductor wire
A, B Connection structure
20 Manufacturing apparatus
80 Superconductor cable (superconductor equipment)
99 Superconductor current limiter (superconductor equipment)
130 Superconductor motor (superconductor equipment)
100 Superconductor coil (superconductor equipment)

The invention claimed is:
1. An oxide superconductor wire comprising:
a superconductor laminate comprising a tape-shaped substrate, an interlayer, an oxide superconductor layer, and a protection layer which are formed on the substrate;
a metal stabilization layer covering the periphery of the superconductor laminate;
a first electrically conductive joint material arranged between the superconductor laminate and the metal stabilization layer; and
a sealing member formed from a metal foil, connected to a terminal of the superconductor laminate, and extending in the longitudinal direction of the superconductor laminate,
wherein the metal stabilization layer comprises an extension part formed so as to cover the periphery of the sealing member, and
wherein the first electrically conductive joint material comprises an extension part arranged between the extension part of the metal stabilization layer and the sealing member and formed so as to cover the periphery of the sealing member.

2. The oxide superconductor wire according to claim 1, wherein the sealing member is butt-welded to the terminal of the superconductor laminate.

3. The oxide superconductor wire according to claim 1,
wherein a recess is formed in the terminal of the superconductor laminate, and
wherein an end of the sealing member is overlaid on and welded to the recess.

4. A connection structure of an oxide superconductor wire comprising:
a first oxide superconductor wire and a second oxide superconductor wire which are the oxide superconductor wire according to claim 1; and
a second electrically conductive joint material joining the first oxide superconductor wire and the second oxide superconductor wires together,
wherein upper faces of the metal stabilization layers arranged at an upside of the first oxide superconductor wire and the second oxide superconductor wires are mutually overlaid so as to oppose to each other, and are joined together with the second electrically conductive joint material.

5. A connection structure of an oxide superconductor wire comprising:
a first oxide superconductor wire, a second oxide superconductor wire, and a third oxide superconductor wire which are the oxide superconductor wire according claim 1;
a third electrically conductive joint material joining the first oxide superconductor wire and the third oxide superconductor wire together; and
a fourth electrically conductive joint material joining the second oxide superconductor wire and the third oxide superconductor wire together,
wherein an upper face of the metal stabilization layer arranged at an upside of the first oxide superconductor wire and an upper face of the metal stabilization layer arranged at an upside of the third oxide superconductor wire are mutually overlaid so as to oppose to each other, and are joined together with the third electrically conductive joint material, and
wherein an upper face of the metal stabilization layer arranged at an upside of the second oxide superconductor wire and the upper face of the metal stabilization layer arranged at the upside of third oxide superconductor wire are mutually overlaid so as to oppose to each other, and are joined together with the fourth electrically conductive joint material.

6. A superconductor equipment comprising the oxide superconductor wire according to claim 1.

7. A superconductor equipment comprising the connection structure of a oxide superconductor wire according to claim 4.

8. A manufacturing method of the oxide superconductor wire according to claim 1, the method comprising:
   joining the sealing member to the terminal of the superconductor laminate;
   with a use of a coated metal tape of which at least one surface is provided with the first electrically conductive joint material, adhering the coated metal tape to the periphery of the sealing member and the periphery of the superconductor laminate by roll forming,
   covering the periphery of the superconductor laminate with the first electrically conductive joint material and the metal stabilization layer by melting and solidifying the first electrically conductive joint material; and
   covering the periphery of the sealing member with the extension part of the electrically conductive joint material and the extension part of the metal stabilization layer.

* * * * *